United States Patent
Qureshi et al.

(10) Patent No.: US 7,212,039 B2
(45) Date of Patent: May 1, 2007

(54) DYNAMIC LOGIC REGISTER

(75) Inventors: Imran Qureshi, Austin, TX (US); James R. Lundberg, Austin, TX (US)

(73) Assignee: Via Technologies, Inc., Taipei (TW)

( * ) Notice: Subject to any disclaimer, the term of this patent is extended or adjusted under 35 U.S.C. 154(b) by 90 days.

(21) Appl. No.: 10/925,307

(22) Filed: Aug. 24, 2004

(65) Prior Publication Data

US 2005/0046446 A1 Mar. 3, 2005

Related U.S. Application Data

(63) Continuation-in-part of application No. 10/730,703, filed on Dec. 5, 2003, now Pat. No. 6,965,254.

(60) Provisional application No. 60/498,187, filed on Aug. 27, 2003.

(51) Int. Cl.
*H03K 19/096* (2006.01)

(52) U.S. Cl. .......................... 326/98; 326/96
(58) Field of Classification Search ................ 326/98, 326/95–97; 327/211, 212
See application file for complete search history.

(56) References Cited

U.S. PATENT DOCUMENTS

| | | |
|---|---|---|
| 5,075,386 A | 12/1991 | Vanderbilt |
| 5,796,282 A | 8/1998 | Sprague et al. |
| 5,828,234 A | 10/1998 | Sprague et al. |
| 5,889,979 A | 3/1999 | Miller, Jr. et al. |
| 6,111,444 A | 8/2000 | Mikan, Jr. et al. |
| 6,133,759 A * | 10/2000 | Beck et al. .................. 326/98 |
| 6,181,180 B1 | 1/2001 | Chen et al. |
| 6,201,415 B1 | 3/2001 | Manglore |
| 6,265,897 B1 | 7/2001 | Poirier et al. |

(Continued)

FOREIGN PATENT DOCUMENTS

EP 0921639 A1 6/1999

OTHER PUBLICATIONS

Partovi H et al: "Flow-through latch and edge-triggered flip-flop hybrid elements" Solid-state Circuits Conference, 1996. Digest of Technical Papers. 42nd ISSCC., 1996 IEEE International San Francisco, CA, USA Feb. 8-10, 1996, New York, NY, USA, IEEE, US, Feb. 8, 1996, pp. 138-139, XP010156427 ISBN: 0-7803-3136-2 *figure 8*.

*Primary Examiner*—James H. Cho
(74) *Attorney, Agent, or Firm*—Gary R. Stanford; Richard K. Huffman; James W. Huffman (57) ABSTRACT

A dynamic logic register including a complementary pair of evaluation devices, delayed inversion logic, a dynamic evaluator, latching logic, and a keeper circuit coupled to the output. The evaluation devices are responsive to a clock signal and provide a pre-charged node and an evaluation node. The delayed inversion logic outputs a complete signal that is a delayed and inverted version of the clock signal. The dynamic evaluator, coupled between the pre-charged and evaluation nodes, evaluates a logic function based on a data signal during an evaluation period between operative edges of the clock and complete signals. The latching logic enables the state of an output node to be determined by the state of the pre-charged node during the evaluation period and otherwise clamps the pre-charged node to prevent perturbations of the data signal from propagating to the output node.

16 Claims, 4 Drawing Sheets

U.S. PATENT DOCUMENTS

| | | |
|---|---|---|
| 6,498,514 B2 | 12/2002 | Alvandpour |
| 6,549,038 B1 | 4/2003 | Sechen et al. |
| 6,686,775 B2 * | 2/2004 | Campbell ............ 326/93 |
| 6,791,365 B2 * | 9/2004 | Bosshart ............ 326/98 |
| 2002/0158670 A1 | 10/2002 | Alvandpour |
| 2003/0042932 A1 | 3/2003 | Bales |
| 2003/0052714 A1 | 3/2003 | Alvandpour |
| 2003/0062925 A1 | 4/2003 | Nedovic et al. |
| 2003/0110404 A1 | 6/2003 | Seningen et al. |

* cited by examiner

FIG. 3     TIME →

DYNAMIC LOGIC REGISTER

CROSS-REFERENCE TO RELATED APPLICATIONS

This application claims the benefit of U.S. Provisional Application Ser. No. 60/498187, filed on 8/27/2003, which is herein incorporated by reference for all intents and purposes.

This application is a continuation-in-part of the following U.S. patent application Ser. No. 10/730,703, filed Dec. 5, 2003, now U.S. Pat. No. 6,965,245, which has a common assignee and at least one common inventor, and which is herein incorporated by reference in its entirety for all intents and purposes:

| SER. NO. | FILING DATE | TITLE |
|---|---|---|
| 10/730703 (CNTR.2196) | Dec. 5, 2003 | DYNAMIC LOGIC REGISTER |

BACKGROUND OF THE INVENTION

1. Field of the Invention

The present invention relates to dynamic logic and register functions, and more particularly to a dynamic logic register that provides registered outputs for logic evaluation functions.

2. Description of the Related Art

Integrated circuits use a remarkable number of registers, particularly those having a synchronous pipeline architecture. Register logic is employed to hold the outputs of devices and circuits for a period of time so that these outputs can be received by other devices and circuits. In a clocked system, such as a pipeline microprocessor, registers are used to latch and hold the outputs of a given pipeline stage for a period of one clock cycle so that input circuits in a subsequent stage can receive the outputs during that period while the given pipeline stage is concurrently generating new outputs.

In the past, it has been common practice to precede and follow complex logical evaluation circuits, such as multiple input multiplexers (muxes), multi-bit encoders, etc., with registers to hold the inputs to and the outputs from the evaluation circuits. Generally, these registers have associated setup and hold time requirements, both of which constrain the evaluation circuits in the preceding stage. In addition, registers have corresponding clock-to-output time characteristics, which constrain the evaluation circuits in subsequent stages. The "speed" of a register is typically judged in terms of its data-to-output time, that is, the sum of its setup time and clock-to-output time.

Preceding and following a logical evaluation circuit with traditional register circuits introduces delays into a pipeline system whose cumulative effect results in significantly slower operating speeds. More specifically, one notable source of these delays is the setup time requirements that must be satisfied by logical evaluation circuits in order to ensure stable registered outputs. It is desired to reduce these delays to provide additional time in each stage and to thereby increase overall speed of the pipeline system It is further desired to optimize characteristics of the pipeline system so that it will provide superior performance under a wide variety of operating environments.

SUMMARY OF THE INVENTION

A dynamic logic register according to an embodiment of the present invention includes a complementary pair of evaluation devices, delayed inversion logic, a dynamic evaluator, latching logic, and a keeper circuit. The complementary pair of evaluation devices is responsive to a clock signal and provides a pre-charged node and an evaluation node. The delayed inversion logic receives the clock signal and outputs a complete signal that is a delayed and inverted version of the clock signal. The dynamic evaluator is coupled between the pre-charged and evaluation nodes and evaluates a logic function based on at least one input data signal during an evaluation period between an operative edge of the clock signal and a next edge of the complete signal. The latching logic, being responsive to the clock and complete signals and the state of the pre-charged node, enables the state of an output node to be determined by the state of the pre-charged node during the evaluation period and otherwise clamps the pre-charged node to prevent perturbations of the data signal from propagating to the output node. The keeper circuit is coupled to the output node to maintain the output node when it is tri-stated or otherwise not being driven to a particular logic state. The latching logic includes an N-channel pass device having a gate receiving the complete signal and a drain and source coupled between the pre-charged node and a pull-up control node; a first P-channel pull-up device having a gate receiving the complete signal and a drain, and source coupled between a source voltage and the pull-up control node; a second P-channel pull-up device having a gate coupled to the pull-up control node and a drain and source coupled between the source voltage and the output node; a clamp device, coupled between the pre-charged node and the evaluation node and responsive to the computer signal, that clamps the pre-charged node to the evaluation node while the complete signal is low; and a short stack of N-channel pull-down devices coupled between the output node and ground and controlled by the clock signal and the pre-charged node.

In various specific embodiments, the complementary pair of evaluation devices may include a pull-up P-channel device and a pull-down N-channel device. The dynamic evaluator may range from a very simple circuit to a more complex logic circuit. The dynamic logic register may include an output buffer/inverter having an input coupled to the output node and an output coupled to an inverted output node.

The clamp device may include an inverter having an input coupled to the complete signal and an output and an N-channel clamp device having a drain and source coupled between the pre-charged and evaluation nodes and a gate coupled to the output of the inverter. The short stack of N-channel pull-down devices may include first and second N-channel stack devices. The first N-channel stack device has a gate receiving the clock signal, a drain coupled to the output node, and a source. The second N-channel stack device has a gate coupled to the pre-charged node, a drain coupled to the source of the first N-channel pull-down device, and a source coupled to ground.

A dynamic latch circuit according to an embodiment of the present invention includes a dynamic circuit, a delayed inverter, a latching circuit, and a keeper circuit. The dynamic circuit pre-charges a first node while a clock signal is low and pulls a second node low when the clock signal goes high to enable evaluation of a logic function to control the state of the first node. The delayed inverter receives the clock signal provides an inverted delayed clock signal. The latching circuit enables the state of an output node to be controlled by the state of the first node during an evaluation period beginning when the clock signal goes high and ending when the inverted delayed clock signal next goes low, and otherwise clamps the first node to isolate the output node.

In this case, the latching circuit may include first and second N-channel devices, an inverter, a P-channel device and a stack of devices. The first N-channel device couples a third node to the first node when the inverted delayed clock signal is high. The inverter receives the inverted delayed clock signal and provides a delayed clock signal. The second N-channel device couples the first and second nodes together when the delayed clock signal is high. The P-channel device pulls the third node high while the inverted delayed clock signal is low. The stack of devices pulls the output node high when the third node is low and pulls the output node low during the evaluation period if the first node is high. The stack of devices may include a second P-channel device and third and fourth N-channel devices. The second P-channel device pulls the output node high when the third node is low. The third and fourth N-channel devices, being coupled in series between the output node and ground, pull the output node low when the clock signal and the first node are both high.

A method of dynamically registering an output signal according to an embodiment of the present invention includes pre-charging a first node high while a clock signal is low, releasing the first node and pulling a second node low when the clock signal goes high, evaluating a logic function coupled between the first and second nodes for controlling the logic state of the first node while the clock signal is high, delaying and inverting the clock signal and providing a delayed inverted clock signal, controlling the logic state of an output node with the first node during an evaluation period beginning when the clock signal goes high and ending when the delayed inverted clock signal next goes low, and maintaining the logic state of the output node between evaluation periods including clamping the first node to the second node while the delayed inverted clock signal is low.

The method may include buffering and inverting the output node. The method may include passing a logic state of the first node to a pull-up control node, pulling the output node high if the pull-up control node is low, and pulling the output node low if the first node is high. The method may include isolating the output node from the pull-up control node, and clamping the first node low to turn off a stack device coupled between the output node and a low node. The method may include inverting the delayed inverted clock signal and providing a delayed clock signal, and activating an N-channel device to clamp the first node to the second node while the delayed clock signal is high.

BRIEF DESCRIPTION OF THE DRAWINGS

The benefits, features, and advantages of the present invention will become better understood with regard to the following description, and accompanying drawings where.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

The inventors of the present application have recognized the need for providing registered outputs for logic circuits in which speed is a critical factor and also for optimizing the overall design such as by reducing the number of devices to increase speed and reduce chip area consumed. They have therefore developed a dynamic logic register that provides latched inputs and registered outputs for logic evaluation functions which is markedly faster than prior configurations and which minimizes the number of N-channel devices in stacks used to isolate the sampled state of the output to increase speed and reduce the number of devices and area layout on a chip, as will be further described below with respect to FIGS. 1–4. When employed in a pipeline architecture that relies heavily on registers to transfer data from stage to stage, a dynamic logic register according to an embodiment of the present invention enables overall device operating speed to be significantly increased while reducing chip layout area.

Figure 1:
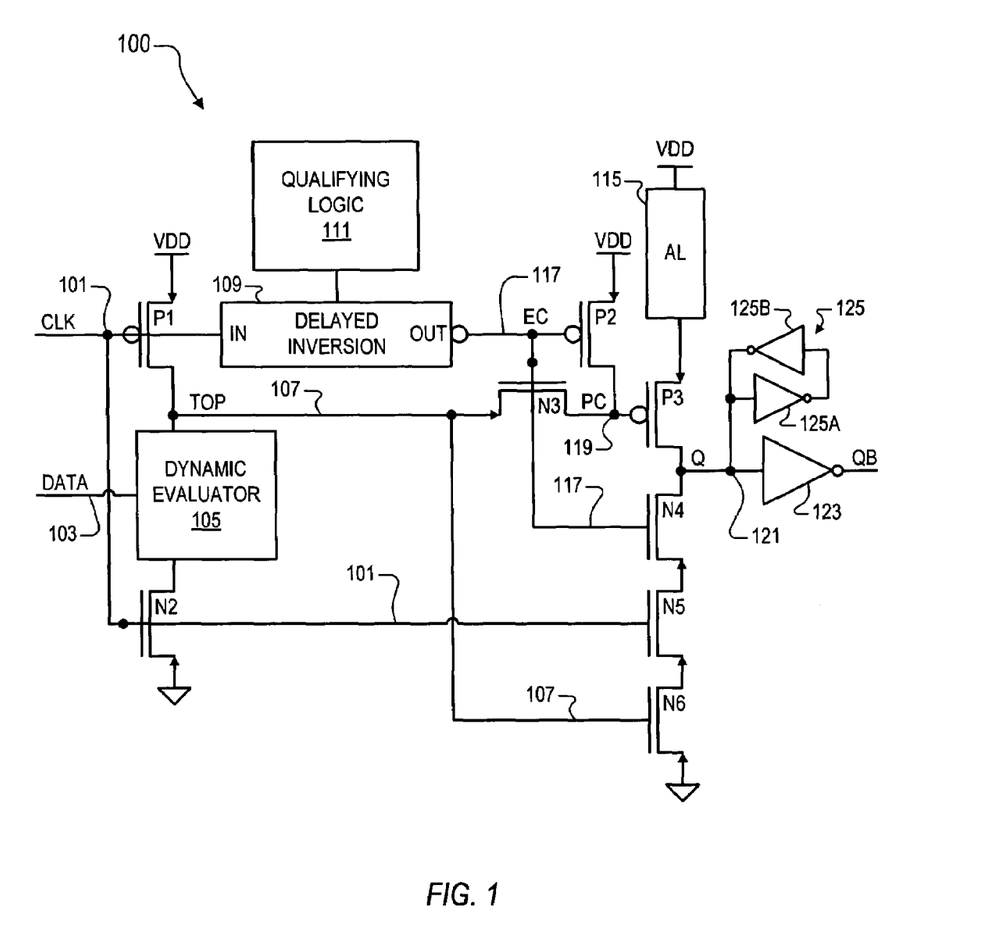
FIG. 1 is a schematic diagram of a dynamic logic register implemented according to an exemplary embodiment of an invention of a prior and related disclosure.

FIG. 1 is a schematic diagram of a dynamic logic register 100 implemented according to an exemplary embodiment of the invention of a prior and related disclosure, Ser. No. 10/730703, having docket number CNTR.2196 (hereinafter "prior disclosure CNTR.2196"). The input portion of the dynamic logic register 100 includes a P-channel device P1 and an N-channel device N2 configured as a complementary pair of evaluation devices. The source of P1 is coupled to a source voltage VDD and its drain is coupled to a pre-charge node 107 providing a signal TOP. A dynamic evaluator circuit 105 is coupled between the node 107 and the drain of N2, which has its source coupled to ground. The dynamic evaluator circuit 105 can be as simple as one device (e.g., an N-channel device) or may include a more complex configuration of evaluation logic. In any case, the dynamic evaluator circuit 105 "evaluates" by pulling the TOP signal low when the CLK signal is high. Also, although a single data signal (DATA) is shown being provided to the dynamic evaluator circuit 105 for evaluation, those of ordinary skill in the art will appreciate that any number of data signals may be used during the evaluation process. The dynamic evaluator circuit 105 performs or otherwise evaluates a logic function, which may range from very simple to very complex.

The input clock signal CLK is provided via a node 101 to the gates of P1 and N2, to an input of delayed inversion logic 109 and to the gate of an N-channel device N5. Qualifying logic 111 is coupled to the delayed inversion logic 109 as further described below. The input DATA signal is provided via a node 103 to an input of the dynamic evaluator circuit 105. The node 107 is coupled to the gate of an N-channel device N6, the drain of N6 is coupled to the source of N5 and the source of N6 is coupled to ground. The drain of N5 is coupled to the source of an N-channel device N4, having its drain coupled to a preliminary output node 121. The output of the delayed inversion logic 109 is coupled to a node 117 providing an evaluation complete signal EC, where the node 117 is coupled to the gates of P2, N3, and N4. The source of P2 is coupled to VDD. The node 107 is coupled to the source of the N-channel pass device N3, which has its drain coupled to a pull-up control node 119 providing a pull-up control signal PC. The node 119 is coupled to the drain of P2 and to the gate of P3. The additional logic 115 is coupled between VDD and the source of P3. The drain of P3 is coupled to the drain of N4 at the preliminary output node 121 providing an output signal Q. A keeper circuit 125 is coupled to the node 121, where the keeper circuit 125 includes a first inverter 125A having its input coupled to the node 121 for receiving the Q signal and its output coupled to the input of a second inverter 125B, which has its output coupled to the node 121. In one embodiment, the keeper circuit 125 is a relatively weak keeper circuit that is over-powered by either the pull-up device P3 or the stack of pull-down devices N4–N6.

The output node 121 is coupled to the input of an inverter/buffer 123 having an output generating an inverted output signal QB. Buffering is advantageous to drive the input of subsequent logic or latches since the stack of devices P3 and N4–N6 often present a tri-state condition to the node 121 and the inverter 125B is intentionally a relatively weak device. The inverter/buffer 123 may be replaced by a non-inverting buffer to prevent logic inversion. A non-inverting buffer, however, is often implemented with back-to-back inverters, which may add undesired delay and increase the clock to output time delay.

As described in the prior disclosure CNTR.2196, the interconnected devices P2, N3, P3, N4, and the additional logic 115 form a latching mechanism for the TOP signal, whose state is determined during a short evaluation period between the rising edge of CLK and the falling edge of the EC signal. The EC signal is a delayed inversion of CLK and is referred to herein as an inverted delayed clock signal. The state of TOP during the evaluation period is propagated through the pass device N3 to the PC signal. If the dynamic evaluation logic pulls TOP low, then TOP turns N6 off and PC turns P3 on. If the additional logic 115 has presented VDD to the source of P3 during the evaluation period, then a logic high is provided on the output signal Q via P3. If the additional logic 115 is off during this time, then, even though P3 is on, the state of Q remains at that previously established via the keeper circuit 125. Following the delay period, EC goes low, turning off N3 and N4, and turning on P2, which pulls PC high, thus turning off P3 and consequently tri-stating the output Q. The weak keeper circuit 125 keeps Q at its evaluated level during the remainder of the clock cycle following EC going low.

Registering is accomplished when EC goes low via the latching mechanism in conjunction with device N5. N5 turns off when CLK goes low (and subsequently when EC goes high turning on N4), thus preserving the state of the inverted output signal QB during the second half of the clock cycle. During this half-cycle when EC is still low, P3 remains off as well, preserving the tri-state of output Q. Concurrently, device P1 turns on and N2 turns off, thus pre-charging TOP to a logic high. Following the delay, when EC goes high, device N3 turns on, allowing TOP, pulled high through P1, to maintain a high level on PC, thus keeping P3 turned off.

The delayed inversion logic 109 may be implemented in a variety of ways, such as one or more inverters coupled in series. The qualifying logic 111 can be integrated into the delayed inversion logic 109 to effectively disable the EC signal from ever going high when CLK goes high, thus preventing the evaluated logic function TOP from ever propagating through N3 to the output QB. Functionally, this enables a designer to preserve a preceding state of QB during following clock cycles.

The dynamic logic register 100 provides the speed and evaluation configurability of a dynamic circuit with a significantly reduced input data hold time, along with the output data retention properties of a register. The dynamic logic register 100 exhibits a zero setup time, very short hold time, and a nominal clock-to-output time, thus making it much faster than configurations in which a logical evaluator is preceded and followed by latches. The delayed inversion of CLK combined with the latching mechanism described above provides only a very short interval where the output of the dynamic evaluator TOP is allowed to propagate to output Q. Following the evaluation interval, stack P3, N4, N5, and N6 operate together during the remaining half cycle when CLK high and the following half cycle when CLK is low and high to keep a tri-state condition on the output node 121, whereby the keeper circuit 125 maintains the state of Q that was presented during the evaluation interval. The invention illustrated by the dynamic logic register 100 provides for input latching and output registration of complex logic evaluation functions, and eliminates the setup time requirement normally seen in LATCH-LOGIC-LATCH configurations so that the resulting data-to-output characteristic is much shorter.

It is desired to optimize the characteristics of the dynamic logic register to provide superior performance under a wide variety of operating environments, such as an environment characterized by low temperature, low voltage, and a process that yields fast P-channel devices and slow N-channel devices. In various simulations, it has been observed that the storage node isolation stack including three N-channel devices N4-N6 presented an opportunity to improve the speed and robustness of the dynamic logic register 100. One skilled in the art will appreciate that reducing the number of devices in an N- or P-stack improves speed and further allows for real-estate savings. For example, it is appreciated that, when going from a 2-device stack to a 3-device stack, if it is desired to maintain the same pull-down strength in the 3-device stack as in the 2-device stack, not only is an additional transistor required, but each of the three transistors must be 1 ½ times wider than the devices in the 2-device stack. Consequently, more area on a chip layout is required to provide the same pull-down strength.

Figure 2:
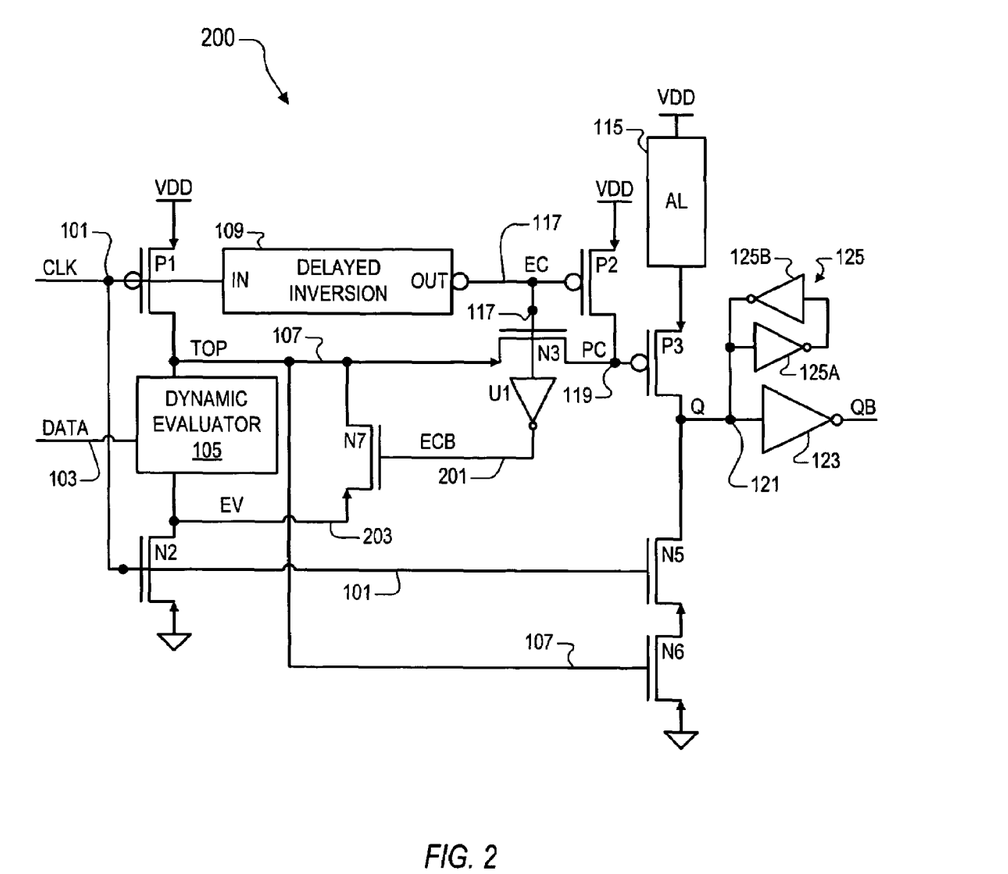
FIG. 2 is a schematic diagram of a dynamic logic register implemented according to an exemplary embodiment of the present invention including a clamping mechanism for isolating the output node.

FIG. 2 is a schematic diagram of a dynamic logic register 200 implemented according to an exemplary embodiment of the present invention. Similar elements and components as the dynamic logic register 100 assume identical reference numbers. The stack of three N-channel devices N4–N6 is reduced to a stack of two N-channel devices N5 and N6, in which N4 is eliminated. The drain of N5 is instead coupled to the preliminary output node 121. Node 117 carrying the EC signal is provided to the input of an inverter U1, which provides an inverted version of EC, referred to as a signal ECB, at its output on a node 201. Since the evaluation complete signal EC is a delayed and inverted version of the CLK signal, the ECB signal is effectively a delayed version of CLK and is referred to as a delayed clock signal. Node 201 is coupled to the gate of a new N-channel device N7, having its drain coupled to node 107 (the TOP signal) and its source coupled to the drain of N2. The drain of N2 forms a node 203 which develops an evaluation signal EV. In a similar manner as the dynamic logic register 100, the drain of N2, or the EV signal, is pulled low when CLK is asserted high to enable evaluation of by the dynamic evaluator circuit 105.

It is desired to isolate the output node 121 providing signal Q when the EC signal goes low. This function was previously accomplished by devices P3 and N4 of the dynamic logic circuit 100. Isolating the output signal Q allows for perturbation of the DATA input signal(s) without adverse consequences to operation of the circuit. The time when the input signals are required to remain stable is commonly referred to as "hold time." After the hold time expires, the DATA inputs are not required to be stable. Eliminating N4 for the dynamic logic circuit 200 reduces the stack of N-channel devices from three devices to two, but does not provide a mechanism for isolating the output node 121 from ground via the path provided by the N-channel devices N5 and N6. Consequently, if TOP has evaluated low, any perturbation of the DATA signal(s) following EC going low (and while N5 is turned on by the CLK signal) might otherwise allow TOP to return high, turning on N6, which would corrupt the output state by pulling the Q signal low.

The inverter U1 and the N-channel device N7, however, collectively form a latch or clamping mechanism that clamps node 107 to node to the node 203 while EC is low, which keeps TOP from going high (due to perturbations on DATA) until CLK subsequently goes low to pre-charge TOP for the next evaluation cycle. The improved dynamic logic register 200 ensures that TOP stays low from the time that EC goes low until CLK next goes low. Accordingly, when EC goes low, ECB goes high turning on N7 and clamping TOP to the logic state of EV. This forces TOP low during the interval of concern, so that any perturbation of the DATA signal which might otherwise cause TOP to go high is now absorbed through the N-channel device N7. In this manner, TOP is purposely discharged when EC goes low, thus isolating the output signal Q for the remainder of the half-cycle of the CLK signal.

Figure 3:
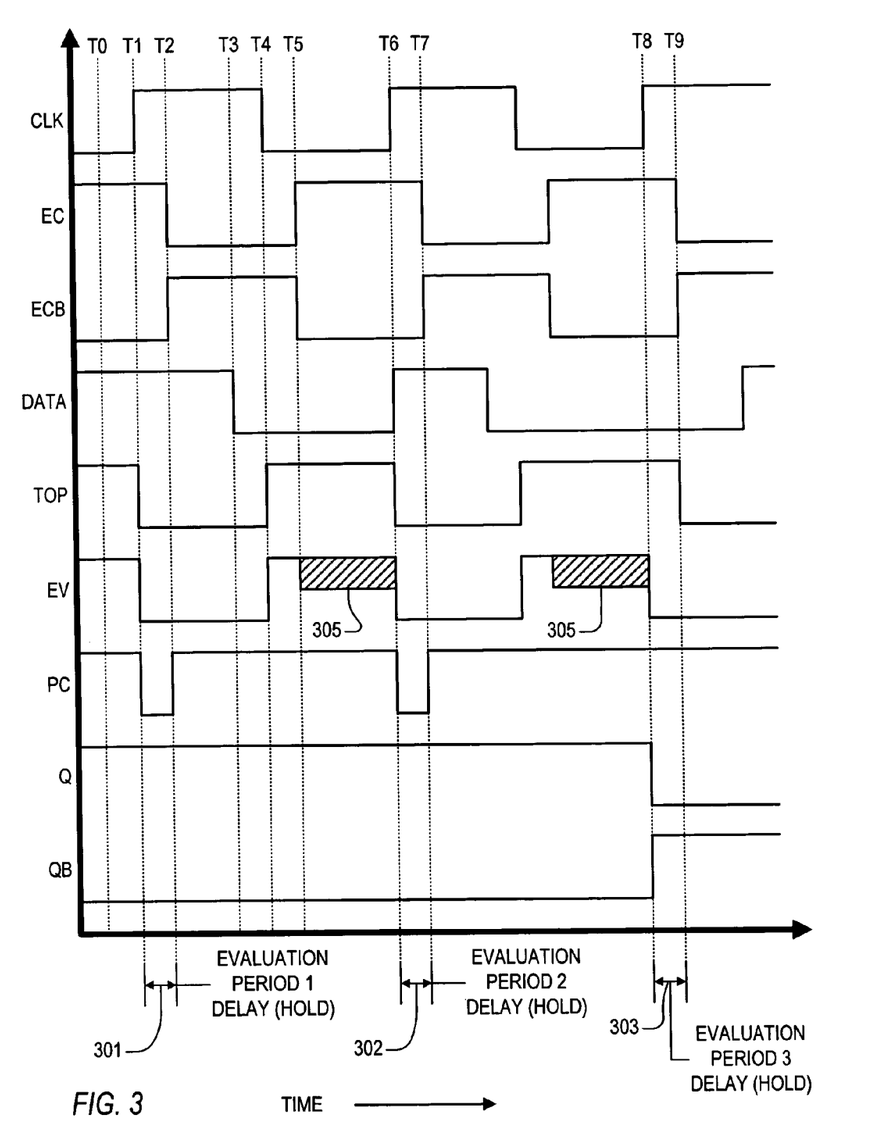
FIG. 3 is a timing diagram illustrating operation of the dynamic logic register of FIG. 2.

FIG. 3 is a timing diagram illustrating operation of the dynamic logic register 200, in which the CLK, EC, ECB, DATA, TOP, EV, PC, Q and QB signals are plotted versus time. At a time T0, the CLK signal is low so that the TOP signal is pre-charged to a high logic level. The EC signal is initially high turning off P2 and turning on N3, so that the PC signal is initially pulled high by the TOP signal via N3. The ECB signal is an inverted version of the EC signal and thus is initially low turning N7 off. P3 and N5 are off providing a tri-state condition to the Q signal, which is maintained at its previous state by the keeper circuit 125. In the case illustrated, the Q signal is initially in a high logic state at time T0, and the QB signal is low. The DATA signal is shown as being initially high. In the particular configuration illustrated, the dynamic evaluator circuit 105 effectively couples the nodes 107 and 203 together when the DATA signal is high. Thus, since N2 is off while CLK is low, the TOP signal initially pulls the EV signal high via the dynamic evaluator circuit 105.

An evaluation period begins upon each rising edge of the CLK signal and ends on the next falling edge of the delayed inverted clock signal EC. The duration of the evaluation period is defined by the amount of delay through the delayed inversion logic 109. The CLK signal rises at subsequent time T1, turning off P1 and turning on N2 and N5 initiating a first evaluation period shown at 301. The EV signal is pulled low when N2 is turned on. The state of the TOP signal during the evaluation period depends upon evaluation of the DATA signal by the dynamic evaluator circuit 105. In the illustrated embodiment of the dynamic evaluator circuit 105, the DATA signal being high at time T1 causes the dynamic evaluator circuit 105 to evaluate pulling TOP low during the evaluation period 301, which turns N6 off. Since the EC signal is still high during the evaluation period 301, the state of TOP is propagated through N3 to the PC signal, which also goes low turning on P3. Assuming that the additional logic 115 presents VDD to the source of P3 during the evaluation period, the Q signal is pulled high (or otherwise stays high) and the QB signal is pulled low (or otherwise stays low).

At time T2 upon expiration of the delay period through the delayed inversion logic 109, the EC signal goes low turning off N3 and turning on P2 and terminating the evaluation period 301. The ECB signal goes high turning N7 on clamping node 107 to the node 203, so that EV pulls TOP low while N2 is on. The PC signal is pulled high again by VDD via P2, so that P3 is turned off. Since CLK is high, N5 remains turned on. While DATA remains high, TOP is low keeping N6 off so that the Q signal is isolated. At time T3 during the half-cycle of CLK being high, the DATA signal goes low. Since N2 is still on, the state of the TOP signal would otherwise be indeterminate depending upon the particular composition of the dynamic evaluator circuit 105, so that perturbations on the DATA signal would otherwise potentially cause TOP to go high again. The inverter U1 pulling ECB high and turning on N7 during the remaining half-cycle, however, keeps TOP low and N6 off so that Q remains isolated. In this manner, perturbations on the DATA signal do not threaten to pull Q low. The keeper circuit 125 keeps the Q signal high during the remainder of the half-cycle while CLK is high, and the inverter 123 maintains the QB signal at the logic low level.

At subsequent time T4, the next falling edge of the CLK signal occurs, which turns N2 off and P1 back on so that the TOP signal is once again pre-charged high by VDD via P1. N5 is turned off by the CLK signal going low at time T4, so that the output node 121 remains isolated even though TOP goes high turning on N6. Since N2 is turned off when CLK goes low at time T4, and since ECB is still high keeping N7 on, TOP is no longer pulled low by EV but instead EV is pulled high by TOP. N3 is turned on by the EC signal going high at time T5, so that the high state of TOP is once again propagated to the PC signal via the pass device N3, which keeps the PC signal high and P3 off. Since DATA is low and N2 and N7 are off, the state of EV is indeterminate after time T5 as shown at 305 during the remaining portion of the half-cycle while CLK is low. Although EV may simply remain high since previously being driven high, and may be driven high by high perturbations of DATA, the state of EV is inconsequential during this time.

Operation is substantially identical beginning on the next rising edge of the CLK signal at time T6. In this case, however, the DATA signal, which was high at the previous rising edge of the CLK signal, is low and then asserted high at approximately the same time as the CLK signal at time T6. Since the DATA signal is high during the second evaluation period shown at 302 from time T6 to subsequent time T7 when the EC signal goes low, the DATA signal is properly evaluated by the operation of the dynamic evaluator circuit 105 with sufficient time so that the Q and QB signals are asserted to the proper state. In this manner, it is appreciated by those of ordinary skill in the art that the setup time is effectively zero since the logic function is successfully evaluated even though the DATA signal transitions at approximately the same time as the CLK signal initiating the evaluation period.

Operation is similar during the third evaluation period shown at 303 between the next rising edge of the CLK signal at time T8 until the subsequent falling edge of the EC signal at time T9. In this case, however, the DATA signal is asserted at a logic low level, so that the dynamic evaluator circuit 105 fails to evaluate and the TOP signal remains high keeping N6 turned on. Since the EC signal is still high, N3 is on and the high state of TOP is propagated to the PC signal keeping P3 off. The CLK signal turns N5 on, and since TOP remains high, the Q signal is discharged to a low logic level at approximately time T8 via the short stack of pull-down devices N5 and N6. The QB signal is asserted high by the inverter 123 at approximately time T8. When the EC signal goes low at time T9 terminating the evaluation period 303, the PC signal is pulled high (or otherwise remains high) by VDD via P2 so that P3 is turned off. Although the TOP signal might otherwise remain high while DATA remains low at time T9, TOP is instead clamped low by EV via N7 since the ECB signal goes high. Thus, the P3 and N6 devices present a tri-state condition to the Q signal once again upon expiration of the evaluation period 303. The state of the Q signal is maintained for the remaining portion of the cycle by the keeper circuit 125 in a similar manner as previously described. In this manner, the Q and QB signals switch during the evaluation period and remain stable for the duration of the CLK cycle after expiration of the evaluation period.

Registering is accomplished at the expiration of each evaluation period when the EC signal goes low via the latching and clamping logic formed by the devices P2, P3, N3, N5, N6, N7 and U1. The EC signal going low shuts off N3 and turns on P2, which pulls the PC signal high turning off P3, and TOP is pulled low by N7 via ECB. Thus, the Q signal is isolated from the pull-up device P3 and the short stack of pull-down devices N5 and N6 during the first half of the clock cycle while the CLK signal is high. When the CLK signal goes low initiating the second half of the clock cycle, N5 turns off and while the EC signal is still low and P3 remains off as well thereby preserving the state of the Q signal (which remains isolated from the pull-up and pull-down devices). Concurrently, P1 turns on and N2 turns off, thus pre-charging the TOP signal to a logic high. When the EC signal goes high, N3 turns on, allowing the high state of the TOP signal to propagate through to the PC signal, thus keeping P3 turned off. Thus, the states of the Q and QB signals are maintained by the keeper circuit 125 from the expiration of each evaluation period to the beginning of the next evaluation period regardless of changes of the input data signals.

The additional logic 115 enables functions that can override or otherwise prevent logic high outputs on the Q signal. The qualifying logic 111 is coupled to or otherwise integrated into the delayed inversion logic 109 to effectively disable the EC signal from ever going high when the CLK signal goes high, thus preventing the TOP signal representing the evaluated logic function from ever propagating through N3 to the output QB. Functionally, this enables a designer to preserve a preceding state of the Q and QB signals during subsequent clock cycles, if desired.

Figure 4:
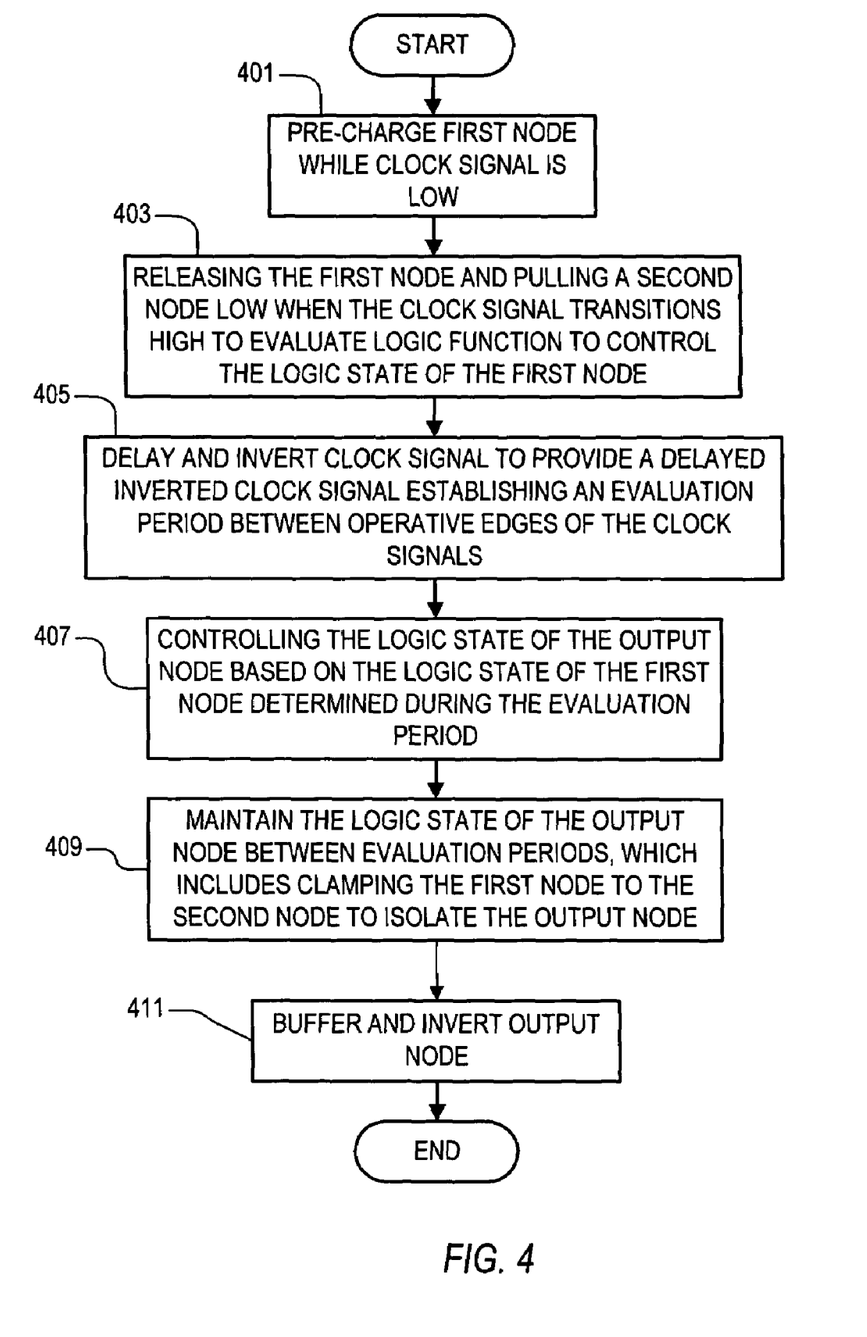
FIG. 4 is a flowchart diagram illustrating a method of dynamically registering an output signal according to an exemplary embodiment of the present invention.

FIG. 4 is a flowchart diagram illustrating a method of dynamically registering an output signal according to an exemplary embodiment of the present invention. Operation begins at a first block 401 in which a first node is pre-charged while a clock signal is low. Operation proceeds to next block 403, in which the first node is released and a second node is pulled low when the clock signal transitions high to enable evaluation of a logic function to control the logic state of the first node. For example, the dynamic evaluator 105 evaluates a logic function based on one or more input data signals when the clock signal is asserted high. At next block 405, the clock signal is delayed and inverted to provide a delayed inverted clock signal. For example, the delayed inversion logic 109 delays the CLK signal to provide the EC signal. The duration of the clock delay can be configured to provide the minimum delay necessary to ensure completion of evaluation of the logic function being evaluated. In a synchronous pipeline architecture, such as a pipeline microprocessor or the like, the delays of the stages might be varied depending upon the corresponding logic function of each stage. Alternatively, a common delay may be determined based on the minimum time necessary to evaluate the longest-duration logic evaluation required in the series of stages. The duration of the delay establishes an evaluation period beginning with the operative transition of the clock signal (e.g., the rising edge of CLK), and the corresponding next transition of the inverted delayed clock signal (e.g., the next falling edge of EC).

At next block 407, the logic state of the output node is controlled based on the logic state of the first node as determined during the evaluation period. With reference to the dynamic logic register 100, the Q signal is latched low if TOP remains high during the evaluation period, and is latched high if TOP is pulled low during the evaluation period. At next block 409, the logic state of the output node (e.g., the Q signal) is maintained between the expiration of each evaluation period and the beginning of the next evaluation period. This includes clamping the first node to the second node to isolate the output node from the first node between evaluation periods or at least until the CLK signal next goes low. In the illustrated embodiment, the EC signal is inverted by U1 providing the delayed clock signal ECB, which turns N7 on after the evaluation period is over. This pulls TOP low until CLK is next asserted low, which turns the stack device N6 off isolating the output node. In this manner, once the logic state is determined upon the expiration of each evaluation period, the state of the output is maintained until the next evaluation period to ensure the integrity of the output signal regardless of fluctuations of input data signals. At final block 411, the output node is buffered and inverted to drive subsequent inputs.

A dynamic logic register according to an embodiment of the present invention provides the speed and evaluation configurability of a dynamic circuit with a significantly reduced input data hold time, along with the output data retention properties of a register. It also exhibits a zero setup time, a very short hold time, and a nominal clock-to-output time, thus making it much faster than configurations in which a logical evaluator is preceded and followed by latches. A delayed and inverted version of the CLK signal (e.g., the EC signal) combined with latching and clamping mechanisms to provide a relatively short evaluation interval during which the output of the dynamic evaluator (e.g., the TOP signal) is allowed to propagate to a preliminary output node (e.g., the Q signal). Following the evaluation interval, the output stack devices (e.g., P3, N5, and N6 ) operate together during the remaining half clock cycle when the CLK signal is high and the following half cycle when CLK is low and high to present a tri-state condition to the preliminary output node. U1 and N7 form a clamp circuit to keep TOP low which facilitates isolation of the output node.

This enables elimination of an N-channel device in the stack configuration for optimization and superior performance under a wide variety of operating environments. In particular, smaller (e.g., narrower) N-channel devices may be used to maintain the same pull-down strength for the short stack (two devices) as compared to three devices. Consequently, speed is increased and less area is consumed on a chip layout.

A dynamic logic registering mechanism according to an embodiment of the present invention provides for input latching and output registration of complex logic evaluation functions. In addition, since the present invention eliminates the setup time requirement normally seen in LATCH-LOGIC-LATCH configurations, the resulting data-to-output characteristic is significantly reduced. The dynamic logic registering mechanism provides latched inputs and registered outputs for simple to complex logic evaluation functions that are markedly faster than present day configurations. When employed in a pipeline architecture that relies heavily on registers to transfer data from stage to stage, the present invention enables overall device operating speed to be significantly increased.

Although the present invention has been described in considerable detail with reference to certain preferred versions thereof, other versions and variations are possible and contemplated. For example, the dynamic evaluator circuit can be as simple or as complex as desired. The qualifying logic and the additional logic may be omitted or otherwise implemented in any suitable manner as understood by those of ordinary skill in the art. Moreover, although the present disclosure contemplates one implementation using metal-oxide semiconductor (MOS) type devices, including complementary MOS devices and the like, such as, for example, NMOS and PMOS transistors, it may also be applied in a similar manner to different or analogous types of technologies and topologies, such as bipolar devices or the like.

The invention claimed is:

1. A dynamic logic register, comprising:
   a complementary pair of evaluation devices responsive to a clock signal and providing a pre-charged node and an evaluation node;
   delayed inversion logic that receives said clock signal and that outputs a complete signal being a delayed and inverted version of said clock signal;
   a dynamic evaluator, coupled between said pre-charged node and said evaluation node, that evaluates a logic function based on at least one input data signal during an evaluation period between an operative edge of said clock signal and a next edge of said complete signal;
   latching logic, responsive to said clock and complete signals and the state of said pre-charged node, that enables the state of an output node to be determined by the state of said pre-charged node during said evaluation period and that otherwise clamps said pre-charged node to prevent perturbations of said at least one data signal from propagating to said output node, said latching logic comprising:
      an N-channel pass device having a gate receiving said complete signal and a drain and source coupled between said pre-charged node and a pull-up control node;
      a first P-channel pull-up device having a gate receiving said complete signal and a drain and source coupled between a source voltage and said pull-up control node;
      a second P-channel pull-up device having a gate coupled to said pull-up control node and a drain and source coupled between said source voltage and said output node;
      a clamp device, coupled between said pre-charged node and said evaluation node and responsive to said complete signal, that clamps said pre-charged node to said evaluation node while said complete signal is low; and
      a short stack of N-channel pull-down devices coupled between said output node and ground and controlled by said clock signal and said pre-charged node; and
   a keeper circuit coupled to said output node.

2. The dynamic logic register of claim 1, wherein said complementary pair of evaluation devices comprises:
   a P-channel device having a gate receiving said clock signal and a drain and source coupled between a source voltage and said pre-charged node; and
   an N-channel device having a gate receiving said clock signal and a drain and source coupled between said evaluation node and ground.

3. The dynamic logic register of claim 1, wherein said dynamic evaluator comprises a complex logic circuit.

4. The dynamic logic register of claim 1, wherein said clamp device comprises:
   an inverter having an input coupled to said complete signal and an output; and
   an N-channel clamp device having a drain and source coupled between said pre-charged node and said evaluation node, and having a gate coupled to said output of said inverter.

5. The dynamic logic register of claim 1, wherein said short stack of N-channel pull-down devices comprises:
   a first N-channel stack device having a gate receiving said clock signal, a drain coupled to said output node, and a source; and
   a second N-channel stack device having a gate coupled to said pre-charged node, a drain coupled to said source of said first N-channel pull-down device, and a source coupled to ground.

6. The dynamic logic register of claim 1, further comprising additional logic coupled between said source voltage and said second P-channel pull-up device operative to prevent a selected state of said output node.

7. The dynamic logic register of claim 1, further comprising an output buffer/inverter having an input coupled to said output node and an output coupled to an inverted output node.

8. A dynamic latch circuit, comprising:
   a dynamic circuit that pre-charges a first node while a clock signal is low and that pulls a second node low when said clock signal goes high to enable evaluation of a logic function to control the state of said first node;
   a delayed inverter that receives said clock signal and that provides an inverted delayed clock signal;
   a latching circuit, coupled to said dynamic circuit and said delayed inverter, that enables the state of an output node to be controlled by the state of said first node during an evaluation period beginning when said clock signal goes high and ending when said inverted delayed clock signal next goes low, and that clamps said first node to isolate said output node, said latching circuit comprising:
      a first N-channel device that couples a third node to said first node when said inverted delayed clock signal is high;

an inverter that receives said inverted delayed clock signal and that provides a delayed clock signal;

a second N-channel device that couples said first and second nodes together when said delayed clock signal is high;

a first P-channel device that pulls said third node high while said inverted delayed clock signal is low; and a stack of devices, coupled to said output node, that pulls said output node high when said third node is low and that pulls said output node low during said evaluation period if said first node is high; and a keeper circuit coupled to said output node.

9. The dynamic latch circuit of claim 8, wherein said dynamic circuit comprises:

a P-channel device that pre-charges said first node while said clock signal is low;

a logic circuit, coupled between said first and second nodes, that evaluates said logic function; and an N-channel device, coupled to said second node, that enables said logic circuit to evaluate said logic function when said clock signal goes high.

10. The dynamic latch circuit of claim 8, wherein said stack of devices comprises:

a second P-channel device that pulls said output node high when said third node is low; and third and fourth N-channel devices, coupled in series between said output node and ground, that pull said output node low when said clock signal and said first node are both high.

11. The dynamic latch circuit of claim 8, further comprising additional logic coupled to said latching circuit to prevent a predetermined logic state of said output node.

12. A method of dynamically registering an output signal, comprising:

pre-charging a first node high while a clock signal is low;

releasing the first node and pulling a second node low when the clock signal goes high;

evaluating a logic function coupled between the first and second nodes which controls the logic state of the first node while the clock signal is high;

delaying and inverting the clock signal and providing a delayed inverted clock signal;

controlling the logic state of an output node with the first node during an evaluation period beginning when the clock signal goes high and ending when the delayed inverted clock signal next goes low, wherein said controlling the logic state of the output node with the first node comprises:

passing a logic state of the first node to a pull-up control node;

pulling the output node high if the pull-up control node is low; and pulling the output node low if the first node is high; and maintaining the logic state of the output node between evaluation periods including clamping the first node to the second node while the delayed inverted clock signal is low.

13. The method of claim 12, further comprising buffering and inverting the output node.

14. The method of claim 12, wherein said maintaining the logic state of the output node comprises coupling a keeper circuit to the output node.

15. The method of claim 12, wherein said maintaining the logic state of the output node comprises:

isolating the output node from the pull-up control node; and clamping the first node low to turn off a stack device coupled between the output node and a low node.

16. The method of claim 15, wherein said clamping the first node low comprises:

inverting the delayed inverted clock signal and providing a delayed clock signal; and activating an N-channel device to clamp the first node to the second node while the delayed clock signal is high.

* * * * *